United States Patent
Kim et al.

(10) Patent No.: US 11,946,154 B2
(45) Date of Patent: Apr. 2, 2024

(54) DIELECTRIC MATERIAL, DEVICE COMPRISING DIELECTRIC MATERIAL, AND METHOD OF PREPARING DIELECTRIC MATERIAL

(71) Applicant: Samsung Electronics Co., Ltd., Suwon-si (KR)

(72) Inventors: Hyungjun Kim, Suwon-si (KR); Chan Kwak, Yongin-si (KR); Takayoshi Sasaki, Ibaraki (JP); Yasuo Ebina, Ibaraki (JP); Changsoo Lee, Seoul (KR); Dohwon Jung, Seoul (KR); Giyoung Jo, Suwon-si (KR); Takaaki Taniguchi, Ibaraki (JP)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 503 days.

(21) Appl. No.: 17/126,902

(22) Filed: Dec. 18, 2020

(65) Prior Publication Data
US 2021/0198801 A1 Jul. 1, 2021

(30) Foreign Application Priority Data
Dec. 30, 2019 (KR) .......................... 10-2019-0178510

(51) Int. Cl.
C03C 17/23 (2006.01)
C03C 17/00 (2006.01)
C30B 1/02 (2006.01)

(52) U.S. Cl.
CPC ............ *C30B 1/023* (2013.01); *C03C 17/001* (2013.01); *C03C 17/23* (2013.01); *C04B 2235/3258* (2013.01); *C04B 2235/768* (2013.01)

(58) Field of Classification Search
CPC ....... C30B 1/023; C03C 17/001; C03C 17/23; C04B 2235/3258; C04B 2235/768
See application file for complete search history.

(56) References Cited

U.S. PATENT DOCUMENTS 9,187,842 B2 11/2015 Nakajima et al.
2007/0039814 A1* 2/2007 Maggard .................. C02F 1/725
422/186

(Continued)

FOREIGN PATENT DOCUMENTS

KR 10-2018-0111354 A 10/2018

OTHER PUBLICATIONS

Schaak et al (Perovskite by design: A toolbox of solid state reactions Chemical Materials vol. 14, 2002 pp. 1455-1471.*

(Continued)

*Primary Examiner* — Robert M Kunemund
(74) *Attorney, Agent, or Firm* — Harness, Dickey & Pierce, P.L.C.

(57) ABSTRACT

Provided are a dielectric material, a device including the dielectric material, and a method of preparing the dielectric material, in which the dielectric material may include: a layered perovskite compound, wherein the layered perovskite compound may include at least one selected from a Dion-Jacobson phase, an Aurivillius phase, and a Ruddlesden-Popper phase, a temperature coefficient of capacitance (TCC) of a capacitance at 200° C. with respect to a capacitance at 40° C. may be in a range of about −15 percent (%) to about 15%, and a permittivity of the dielectric material may be 200 or greater in a range of about 1 kilohertz (kHz) to about 1 megahertz (MHz).

26 Claims, 9 Drawing Sheets

(56) References Cited

U.S. PATENT DOCUMENTS

2013/0065065 A1* 3/2013 Nakajima ............. C04B 35/495
502/340
2018/0286586 A1 10/2018 Jung et al.

OTHER PUBLICATIONS

Mir Im, et al., "Synthesis and effect of Ba2+ ions on the dielectric properties of the layered-perovskite KSr2NaNb4O13 ceramics" Materials Research Bulletin, vol. 105, Sep. 2018, pp. 246-252.

Margret J. Geselbracht, et al., "An Investigation of the Synthesis of the Layered Perovskite RbCa2Nb3O10 Using Time-Resolved in Situ High-Temperature Powder X-ray Diffraction", Chem. Mater. Sep. 5, 2002, 14, 10, p. 4343-4349.

Sakabe et al., "Dielectric Properties of Fine-Grained BATIO3 Ceramics Doped with CAO", Jpn. J. Appl. Phys. vol. 41 (2002) Pt. 1, No. 11B.

Masuno et al., "Stabilization of Metastable Ferroelectric BA1—XCAXTI2o5 by Breaking CA-site Selectivity via Crystallization From Glass", Sci Rep. Oct. 22, 2013;3:3010.

Kimura et al., "Simultaneous Achievement of High Dielectric Constant and Low Temperature Dependence of Capacitance in (111)-Oriented BATIO3—BI(MG0.5TI0.5)O3-BIFEO3 Solid Solution Thin Films", AIP Advances 6, 015304 (2016).

Zhou et al. "Controllable Doping of Nitrogen and Tetravalent Niobium Affords Yellow and Black Calcium Niobate Nanosheets for Enhanced Photocatalytic Hydrogen Evolution", RSCAdcv. ,2016,6, 64930-64936.

* cited by examiner

DIELECTRIC MATERIAL, DEVICE COMPRISING DIELECTRIC MATERIAL, AND METHOD OF PREPARING DIELECTRIC MATERIAL

CROSS-REFERENCE TO RELATED APPLICATION

This application claims the benefit of Korean Patent Application No. 10-2019-0178510, filed on Dec. 30, 2019, in the Korean Intellectual Property Office, the disclosure of which is incorporated herein in its entirety by reference.

BACKGROUND

1. Field

The present disclosure relates to a dielectric material, a device including the dielectric material, and a method of preparing the dielectric material.

2. Description of Related Art

With the demands for continuous miniaturization, thinning, and large capacity of electronic devices, capacitors that may be further miniaturized and thinned, and have large capacity, as compared with existing capacitors, are required.

In order to realize miniaturization, thinning, and large capacity of capacitors, a dielectric material that provides improved dielectric properties is required.

SUMMARY

However, in the manufacture of a multi-layered ceramic capacitor (MLCC), which is a kind of miniaturized and thinned capacitor with large capacity, reductive sintering is required to prevent oxidation of the internal electrodes in a firing process of the internal electrodes and a dielectric material composition.

In such a reductive sintering process, structural defects of the dielectric material may occur, and physical properties of the thus produced dielectric material are deteriorated. Therefore, a dielectric material having improved structural stability and physical properties and a capacitor including the dielectric material are required by preventing deterioration of the dielectric material during such a sintering process.

Provided is a dielectric material having improved structural stability and physical properties.

Provided is a device including the dielectric material.

Provided is a method of preparing the dielectric material.

Additional aspects will be set forth in part in the description which follows and, in part, will be apparent from the description, or may be learned by practice of the presented embodiments of the disclosure.

According to an aspect of an embodiment,
a dielectric material may include a layered perovskite compound, wherein the layered perovskite compound may include at least one selected from a Dion-Jacobson phase, an Aurivillius phase, and a Ruddlesden-Popper phase, a temperature coefficient of capacitance (TCC) of a capacitance at 200° C. with respect to a capacitance at 40° C. may be in a range of about −15 percent (%) to about 15%, and a permittivity of the dielectric material may be 200 or greater in a range of about 1 kilohertz (kHz) to about 1 megahertz (MHz).

According to an aspect of another embodiment, a device may include: a plurality of electrodes; and the dielectric material disposed between a plurality of the electrodes.

According to an aspect of still another embodiment, a method of preparing a dielectric material, the method including: preparing a mixture of a layered perovskite compound including at least one selected from a Dion-Jacobson phase, an Aurivillius phase, and a Ruddlesden-Popper phase, and a metal salt; and heat-treating the mixture in a reducing atmosphere, wherein the metal salt may be represented by Formula 8:

[Formula 8]

wherein M may be an element of Group 1, 2, or 3 of the Periodic Table of Elements, X may include a monovalent anion, a divalent anion, or a trivalent anion, excluding halogen, and 1≤a≤3 and 1≤b≤4.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
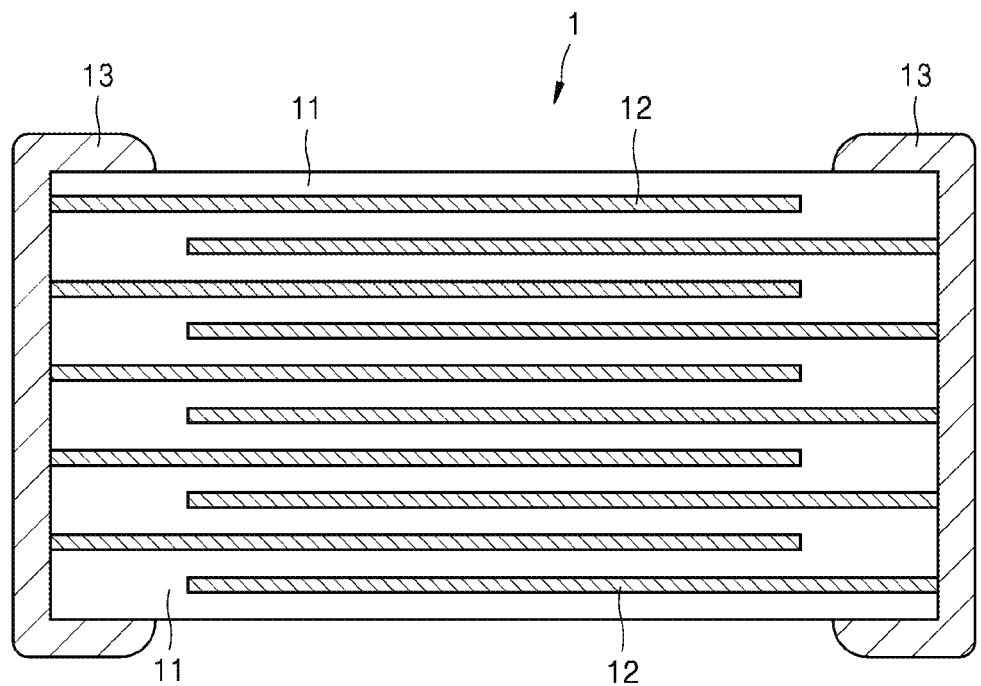
FIG. 1 is a schematic view of an embodiment of a multi-layered ceramic capacitor (MLCC)

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Various embodiments are shown in the accompanying drawings. However, the inventive concepts may be embodied in many different forms, and should not be construed as limited to the embodiments described herein. Rather, these embodiments are provided to enable the present disclosure to be thorough and complete, and will fully convey the scope of the inventive concepts to one of ordinary skill in the art. The same reference numeral refers to the same component.

It will be understood that when a component is referred to as being "on" another component, it may be directly on top of the other component, or another component may be interposed therebetween. In contrast, when a component is referred to as being "directly on" another component, another component is not interposed therebetween.

The terms "first", "second", "third", or the like may be used herein to describe various elements, components, regions, layers, and/or areas, but these elements, components, regions, layers, and/or areas should not be limited by these terms. These terms are only used to distinguish one element, component, region, layer, or area from another element, component, region, layer, or area. Accordingly, a first element, component, region, layer, or area described herein may be referred to as a second component, component, region, layer, or are without departing from the teachings described herein.

The terms used herein are for describing specific embodiments only and are not intended to limit the inventive concepts. The singular form as used herein is intended to include the plural form including "at least one", unless it has a clearly different meaning in the context. "At least one" should not be construed as limiting to the singular form. The term "and/or" as used herein may include any and all combinations of one or more of the list items. As used in the detailed description, the terms "includes" and/or "including" specify the presence of specified features, regions, integers, steps, actions, elements, and/or components, and do not exclude the presence or addition of one or more other features, regions, integers, steps, actions, elements, components, and/or groups thereof.

Spatially relative terms, such as "below", "lower", "bottom", "above", "higher", "top", or the like, are used herein to easily describe the relationship between one element or feature and another element or feature. It will be understood that the spatially relative terms are intended to include different directions of a device in use or operation in addition to the directions shown in the drawings. For example, when a device in the drawing is overturned, elements described as "below" or "under" other elements or features will be oriented "above" the other elements or features. Thus, the exemplary term "under" may encompass both upward and downward directions. The device may be arranged in different directions (rotated 90 degrees or rotated in different directions), and the spatially relative terms used herein may be interpreted accordingly.

Unless defined otherwise, all terms (including technical and scientific terms) used herein have the same meaning as the terms commonly understood by one of ordinary skill in the art to which the present disclosure pertains. In addition, it will be understood that terms as defined in commonly used dictionaries should be construed as having meanings consistent with those in the related art and in the context of the present disclosure, and should not be construed as idealized or overly formal.

Example embodiments are described herein with reference to schematic cross-sectional views of simplified embodiments. As such, changes in the shape in the drawings should be expected as a result of, for example, manufacturing techniques and/or tolerances. Therefore, the embodiments described herein should not be interpreted as being limited to specific shapes of area as shown in the present specification, but should include deviations of shapes resulting from, for example, the manufacture. For example, areas depicted or described as being flat may typically have rough and/or nonlinear features. Moreover, the sharply illustrated angle may be round. Therefore, the areas shown in the drawings are essentially schematic, and the shapes are not intended to show the exact shape of the area, and are not intended to limit the scope of the claims.

When the terms "about" or "substantially" are used in this specification in connection with a numerical value, it is intended that the associated numerical value includes a manufacturing tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

"Group" means a group of the Periodic Table of the Elements according to the International Union of Pure and Applied Chemistry (IUPAC) Group 1-18 group classification system.

Although specific embodiments have been described, alternatives, modifications, variations, improvements, and substantial equivalents that are not currently anticipated may occur to the applicant or one of ordinary skill in the art. Accordingly, the appended claims, which may be filed and amended, are intended to cover all such alternatives, modifications, variations, improvements, and substantial equivalents.

Hereinafter, according to example embodiments, a dielectric material, a device including the dielectric material, and a method of preparing the dielectric material will be described in further detail.

A dielectric material according to one or more example embodiments may include: a layered perovskite compound, wherein the layered perovskite compound may include at least one selected from a Dion-Jacobson phase, an Aurivillius phase, and a Ruddlesden-Popper phase, a temperature coefficient of capacitance (TCC) of a capacitance at 200° C. with respect to a capacitance at 40° C. may be in a range of about −15 percent (%) to about 15%, and a permittivity of the dielectric material may be 200 or greater in a range of about 1 kilohertz (kHz) to about 1 megahertz (MHz). TCC of a capacitance at 200° C. with respect to a capacitance at 40° C. corresponds to a change in permittivity from 200° C. to 40° C., in other words, high temperature characteristics of permittivity. As TCC of a capacitance at 200° C. with respect to a capacitance at 40° C. is in a range of about −15% to about 15%, and a permittivity is 200 or greater in a range of about 1 kHz to about 1 MHz, a capacitor including the dielectric material may have improved dielectric characteristics and facilitate miniaturization, thinning, and large capacity.

A capacitor having a reduced change in capacitance at a high temperature may be obtained by including a dielectric material having good permittivity characteristics (e.g., good permittivity in large thermal ranges) in the capacitor. The dielectric material having good permittivity characteristics may be, for example, obtained by preventing oxygen deficiencies (e.g., oxygen vacancy of a layered perovskite compound) and/or volatilization of a volatile metal during a reduction sintering process during the formation of the dielectric material. Such a dielectric material may be obtained, for example, by adding a metal salt during a reduction sintering process to resolve the aforementioned problem, which is described herein in regards to a method of preparing the dielectric material.

TCC of a capacitance at 200° C. with respect to a capacitance at 40° C. may be, for example, in a range of about −12% to about 12%, about −10% to about 10%, about −8% to about 8%, and/or about −5% to about 5%. A rate of change in capacitance of the dielectric material (e.g., a rate of change in the dielectric material's permittivity) may be calculated according to Equation 1 in Evaluation Example 3. A permittivity of the dielectric material at room temperature (25° C.) in a range of about 1 kHz to about 1 MHz may be, for example, 250 or greater, 300 or greater, 400 or greater, 500 or greater, 600 or greater, 700 or greater, 800 or greater, 900 or greater, 1,000 or greater, or 1,500 or greater. A permittivity of the dielectric material at room temperature (25° C.) in a range of about 1 kHz to about 1 MHz may be, for example, 100,000 or lower, 50,000 or lower, 40,000 or lower, 30,000 or lower, 20,000 or lower, 10,000 or lower, 9,000 or lower, 8,000 or lower, 7,000 or lower, 6,000 or lower, 5,000 or lower, 4,000 or lower, or 3,000 or lower.

The layered perovskite compound including a Dion-Jacobson phase in the dielectric material may be, for example, represented by Formula 1:

$$AB_2C_{n-3}D_nO_{3n+1} \quad \text{[Formula 1]}$$

wherein, in Formula 1, A may be a monovalent element, B may be a divalent element, C may be a monovalent element, D may be a pentavalent element, and n may be an integer from 3 to 6.

In Formula 1, the monovalent elements A and C may be, for example, sodium (Na), potassium (K), rubidium (Rb), or a combination thereof. In Formula 1, A may be identical to or different from C.

In Formula 1, the divalent element B may be, for example, calcium (Ca), strontium (Sr), barium (Ba), or a combination thereof. In Formula 1, the pentavalent element D may be, for example, niobium (Nb), vanadium (V), tantalum (Ta) or a combination thereof.

The layered perovskite compound including a Dion-Jacobson phase in the dielectric material may be, for example, represented by Formula 2:

$$ACa_2C_{n-3}Nb_nO_{3n+1} \quad \text{[Formula 2]}$$

wherein, in Formula 1, A may be Na, K, Rb, or a combination thereof; C may be Na, K, Rb, or a combination thereof; and n may be an integer from 3 to 6.

The layered perovskite compound including a Dion-Jacobson phase in the dielectric material may include, for example, $KCa_2Nb_3O_{10}$, $KCa_2NaNb_4O_{13}$, $KCa_2Na_2Nb_5O_{16}$, $KCa_2Na_3Nb_6O_{19}$, $KCa_2KNb_4O_{13}$, $KCa_2K_2Nb_5O_{16}$, $KCa_2K_3Nb_6O_{19}$, $KCa_2RbNb_4O_{13}$, $KCa_2Rb_2Nb_5O_{16}$, $KCa_2Rb_3Nb_6O_{19}$, $NaCa_2Nb_3O_{10}$, $NaCa_2KNb_4O_{13}$, $NaCa_2K_2Nb_5O_{16}$, $NaCa_2K_3Nb_6O_{19}$, $NaCa_2NaNb_4O_{13}$, $NaCa_2Na_2Nb_5O_{16}$, $NaCa_2Na_3Nb_6O_{19}$, $NaCa_2RbNb_4O_{13}$, $NaCa_2Rb_2Nb_5O_{16}$, $NaCa_2Rb_3Nb_6O_{19}$, $RbCa_2Nb_3O_{10}$, $RbCa_2KNb_4O_{13}$, $RbCa_2K_2Nb_5O_{16}$, $RbCa_2K_3Nb_6O_{19}$, $RbCa_2RbNb_4O_{13}$, $RbCa_2Rb_2Nb_5O_{16}$, $RbCa_2Rb_3Nb_6O_{19}$, $RbCa_2NaNb_4O_{13}$, $RbCa_2Na_2Nb_5O_{16}$, $RbCa_2Na_3Nb_6O_{19}$, or a combination thereof.

The dielectric material may be a sinter of the layered perovskite compound including at least one selected from a Dion-Jacobson phase, an Aurivillius phase, and a Ruddlesden-Popper phase. The sinter may be, for example, a product sintered in a reducing atmosphere. The reducing atmosphere may be an atmosphere including reducing gas such as hydrogen and/or hydrogen-rich gas (e.g., $H_2$, ammonium, methane, or the like). A particle size of the layered perovskite compound included in the sinter may be in a range of about 0.01 micrometers (μm) to about 10 μm, about 0.01 μm to about 5 μm, about 0.01 μm to about 3 μm, about 0.01 μm to about 2 μm, about 0.01 μm to about 1 μm, about 0.01 μm to about 0.5 μm, about 0.01 μm to about 0.3 μm, about 0.01 μm to about 0.2 μm, or about 0.01 μm to about 0.1 μm. A particle size may be identified using, for example, a scanning electron microscope (SEM) image or a transmission electron microscopy (TEM) image. A particle size may be, for example, a length of a major axis of the particle. A particle size may be, for example, a size of a grain of the layered perovskite compound included in the sinter.

The layered perovskite compound may have a particle size greater than a particle thickness. A particle thickness may be, for example, a length of the particle perpendicular to the major plane of a layer in the layered perovskite compound. A ratio of a thickness to width of a particle of the layered perovskite compound particle may be 10 or greater, 100 or greater, 1000 or greater, or 10,000 or greater. As a particle of the layered perovskite compound has such a high aspect ratio, an improved permittivity may be provided, and thinning may be possible.

A difference between a position of a peak shown in a range of about 200 reciprocal centimeters (cm$^{-1}$) to about 300 cm$^{-1}$ in a Raman spectrum of the dielectric material and a position of a peak shown in a range of about 200 cm$^{-1}$ to about 300 cm$^{-1}$ in a Raman spectrum of a non-sintered layered perovskite compound used in preparing the dielectric material may be, for example, 5 cm$^{-1}$ or less, 4 cm$^{-1}$ or less, 3 cm$^{-1}$ or less, and/or 2 cm$^{-1}$ or less. Thus, the dielectric material may provide structural stability and physical properties similar to non-sintered layered perovskite compounds despite undergoing a sintering process in a reducing atmosphere.

The layered perovskite compound including an Aurivillius phase in the dielectric material may be represented by Formula 3:

$$(Bi_2O_2)(A'_{n-1}B'_nO_{3n+1}) \quad \text{[Formula 3]}$$

wherein, in Formula 3, A' may be a monovalent, divalent, or trivalent element, B' may be a trivalent, pentavalent, or hexavalent element, and n may be an integer from 3 to 6.

In Formula 3, for example, A' may be Na, K, Rb, Ca, Sr, or a combination thereof.

In Formula 3, for example, B' may be scandium (Sc), lanthanum (La), titanium (Ti), zirconium (Zr), hafnium (Hf) vanadium (V), niobium (Nb), tantalum (Ta), chromium (Cr), molybdenum (Mo), tungsten (W), manganese (Mn), technetium (Tc), rhenium (Re), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), zinc (Zn), aluminum (Al), gallium (Ga), indium (In), thallium (Tl), or a combination thereof. In Formula 3, for example, B' may be Nb, V, Ta, or a combination thereof.

In the dielectric material, the layered perovskite compound including an Aurivillius phase may be, for example, one or more of $Bi_4Ti_3O_{12}$, $(Bi_2O_2)(Na_{0.5}La_{0.5})Nb_{1.5}W_{0.5}O_7$, $(Bi_2O_2)(Sr(Nba_2Ta_{0.8})_2O_7)$, or the like.

The layered perovskite compound including a Ruddlesden-Popper phase in the dielectric material may be represented by Formula 4:

$$A''_{n''-1}B''_2C''_{n'}O_{3n''+1}$$ [Formula 4]

wherein, in Formula 4, A'' may be a monovalent, divalent, or trivalent element, B'' may be a monovalent, divalent, or trivalent element, C'' may be a trivalent, quadrivalent, pentavalent, or hexavalent element, and n'' may be an integer from 1 to 6.

In Formula 4, for example, and B'' may be Na, K, Rb, Ca, Sr, Ba, lanthanum group element, and/or a combination thereof. In Formula 1, A'' may be identical to or different from B''.

In Formula 4, for example, C'' may be Sc, La, Ti, Zr, Hf, V, Nb, Ta, Cr, Mo, W, Mn, Tc, Re, Fe, Ru, Os, Co, Rh, Ir, Ni, Pd, Pt, Cu, Ag, Au, Zn, Al, Ga, In, Tl, and/or a combination thereof. In Formula 4, for example, C'' may be Nb, V, Ta, and/or a combination thereof.

In the dielectric material, the layered perovskite compound including a Ruddlesden-Popper phase may be, for example, at least one of $Sr_2VO_4$, $Sr_3Ru_2O_7$, $Sr_4Ti_3O_{10}$, $K_2Nd_2Ti_3O_{10}$, or the like.

The dielectric material may include a solid solution of the layered perovskite compound and a metal salt. For example, a solid solution of the layered perovskite compound and a metal salt may be formed, wherein the metal salt is used for preventing oxygen vacancies and the volatilization of alkali metals, which may occur during a reduction sintering process of the layered perovskite compound. The metal salt may melt at a reductive sintering temperature of the layered perovskite compound to form a molten salt, and the molten salt may be mixed with the layered perovskite compound to form a solid solution of the metal salt and the layered perovskite compound. The solid solution of the metal salt and the layered perovskite compound may be, for example, in a grain boundary between grains of the layered perovskite compound included in the sinter. Accordingly, a dielectric material including the solid solution of the metal salt and the layered perovskite compound may provide improved structural stability and physical properties, as comprised with a dielectric material not including the solid solution. For example, a dielectric material including the solid solution of the metal salt and the layered perovskite compound may have a rate of change from a permittivity at 200° C. to a permittivity at 40° C. in a range of about −15% to about 15% and a permittivity of 200 or greater in a range of about 1 kHz to about 1 MHz.

The solid solution of the metal salt and the layered perovskite compound included in the dielectric material may be, for example, represented by one of Formulae 5 to 7:

$$xM_aX_{b-(1-x)}\cdot AB_2C_{n-3}D_nO_{3n+1}$$ [Formula 5]

wherein, in Formula 5, A may be a monovalent element, B may be a divalent element, C may be a monovalent element, D may be a pentavalent element, n may be an integer from 3 to 6, M may be an element of Group 1, 2, or 3 of the Periodic Table of Elements, X may include a monovalent anion, a divalent anion, or a trivalent anion, excluding halogen, and 0<x<1, 1≤a≤3, and 1≤b≤4. In some embodiments, 0<x<0.2, 0.01<x<0.15, 0.02<x<0.1, or 0.03<x<0.1.

$$xM_aX_{b-(1-x)}\cdot[(Bi_2O_2)(A'_{n-1}B'_nO_{3n+1})]$$ [Formula 6]

wherein, in Formula 6, A' may be a monovalent, divalent, or trivalent element, B' may be a trivalent, pentavalent, or hexavalent element, and n may be an integer from 3 to 6, M may be an element of Group 1, 2, or 3 of the Periodic Table of Elements, X may include a monovalent anion, a divalent anion, or a trivalent anion, excluding halogen, and 0<x<1, 1≤a≤3, and 1≤b≤4. In some embodiments, 0<x<0.2, 0.01<x<0.15, 0.02<x<0.1, or 0.03<x<0.1.

$$xM_aX_{b-(1-x)}\cdot A''_{n''-1}B''_2C''_{n'}O_{3n+1}$$ [Formula 7]

wherein, in Formula 7, A'' may be a monovalent, divalent, or trivalent element, B'' may be a monovalent, divalent, or trivalent element, C'' may be a trivalent, quadrivalent, pentavalent, or hexavalent element, and n'' may be an integer from 1 to 6, M may be an element of Group 1, 2, or 3 of the Periodic Table of Elements, X may include a monovalent anion, a divalent anion, or a trivalent anion, excluding halogen, and 0<x<1, 1≤a≤3, and 1≤b≤4.

In some embodiments, 0<x<0.2, 0.01<x<0.15, 0.02<x<0.1, or 0.03<x<0.1.

The solid solution of the metal salt and the layered perovskite compound included in the dielectric material may be, for example, represented by one of Formulae 5a to 7a:

$$xM_aX_{b-(1-x)}\cdot ACa_2C_{n-3}Nb_nO_{3n+1}$$ [Formula 5a]

wherein, in Formula 5a, A may be Na, K, Rb, or a combination thereof, C may be Na, K, Rb, or a combination thereof, and n may be an integer from 3 to 6, M may be K, Na, Rb, or a combination thereof, X may be an anion selected from $OH^-$, $CO_3^{2-}$, $SO_4^{2-}$, $NO^{3-}$, $PO_4^{3-}$, $ONO_3^{3-}$, and $NO_2^-$, and 0<x<1, 1≤a≤3, and 1≤b≤4.

In some embodiments, 0<x<0.2, 0.01<x<0.15, 0.02<x<0.1, or 0.03<x<0.1.

$$xM_aX_{b-(1-x)}\cdot[(Bi_2O_2)(A'_{n-1}B'_nO_{3n+1})]$$ [Formula 6a]

wherein, in Formula 6a, A' may be Na, K, Rb, Ca, Sr, or a combination thereof,

B' may be Sc, La, Ti, Zr, Hf, V, Nb, Ta, Cr, Mo, W, Mn, Tc, Re, Fe, Ru, Os, Co, Rh, Ir, Ni, Pd, Pt, Cu, Ag, Au, Zn, Al, Ga, In, Tl, or a combination thereof, n may be an integer from 3 to 6, M may be K, Na, Rb, or a combination thereof, X may be an anion selected from $OH^-$, $CO_3^{2-}$, $SO_4^{2-}$, $NO^{3-}$, $PO_4^{3-}$, $ONO_3^{3-}$, and $NO_2^-$, and 0<x<1, 1≤a≤3, and 1≤b≤4.

In some embodiments, 0<x<0.2, 0.01<x<0.15, 0.02<x<0.1, or 0.03<x<0.1.

$$xM_aX_{b-(1-x)}\cdot A''_{n''-1}B''_2C''_{n'}O_{3n''+1}$$ [Formula 7a]

wherein, in Formula 7a, A'' may be Na, K, Rb, Ca, Sr, Ba, or a combination thereof, B'' may be Na, K, Rb, Ca, Sr, Ba, or a combination thereof, C'' may be Sc, La, Ti, Zr, Hf, V, Nb, Ta, Cr, Mo, W, Mn, Tc, Re, Fe, Ru, Os, Co, Rh, Ir, Ni, Pd, Pt, Cu, Ag, Au, Zn, Al, Ga, In, Tl, or a combination thereof, n'' may be an integer from 1 to 6, M may be K, Na, Rb, or a combination thereof, X may be an anion selected from $OH^-$, $CO_3^{2-}$, $SO_4^{2-}$, $NO^{3-}$, $PO_4^{3-}$, $ONO_3^{3-}$, and $NO_2^-$, and 0<x<1, 1≤a≤3, and 1≤b≤4.

In some embodiments, 0<x<0.2, 0.01<x<0.15, 0.02<x<0.1, or 0.03<x<0.1.

According to one or more embodiments, a device may include a plurality of electrodes; and the dielectric material disposed between the plurality of the electrodes. For example, the device may include the dielectric material between one or more anodes and one or more cathodes.

As the device includes the dielectric material, the device may have good dielectric characteristics, capacitance, or the like. Accordingly, the device may have good electric characteristics.

The device may be used in an electrical circuit, an electronic circuit, an electromagnetic circuit, or the like, and is not particularly limited as long as the device provides an electrical output for an electrical input. The electrical input may be current or voltage, and the current may be direct current or alternating current. The electrical input may be continuous input or intermittent input by a constant cycle. The device may store electrical energy, electrical signals, magnetic energy and/or magnetic signals. The device may be a semiconductor, a memory, a processor, or the like. The device may be, for example, a resistor, an inductor, a capacitor, or the like.

The device may be, for example, a capacitor. The capacitor may be, for example, a laminated capacitor including a plurality of internal electrodes; and a dielectric material layer alternately disposed between the plurality of internal electrodes. The capacitor may have an independent device form, such as a laminated capacitor, but is not necessarily limited to such a form, and may be included as part of a memory. The capacitor may be, for example, a metal insulator metal (MIM) capacitor mounted in a memory device.

As shown in FIG. 1, a multi-layer capacitor 1 according to one or more embodiments may include a plurality of internal electrodes 12; and a dielectric material layer 11 alternately disposed between the plurality of internal electrodes 12. The multi-layer capacitor 1 may have a structure, in which a plurality of the internal electrodes 12 and the dielectric material layer 11 are alternately stacked, and the dielectric material layer 11 may include the dielectric material. The adjacent internal electrodes 12 may be electrically separated from one another by the dielectric material layer 11 disposed therebetween.

In the multi-layer capacitor 1, as the internal electrodes 12 and the dielectric material layer 11 may be alternately stacked, the dielectric material layer 11 disposed between the adjacent internal electrodes 12 may act as a unit capacitor. For example, adjacent unit capacitors in the multi-layer capacitor 1 may share electrodes but act as separate unit capacitors across the dielectric material layer 11. The dielectric material layer 11 may include the dielectric material as described above, and may include the layered perovskite compound such that the layers of the perovskite compound are substantially parallel with the stacked layers of the multi-layer capacitor 1.

In the multi-layer capacitor 1, the number of the internal electrodes 12 and the dielectric material layer 11, which may be alternately stacked, may each independently be, for example, 2 or greater, 5 or greater, 10 or greater, 20 or greater, 50 or greater, 100 or greater, 200 or greater, 500 or greater, 1,000 or greater, 2,000 or greater, 5,000 or greater, or 10,000 or greater. The multi-layer capacitor 1 may provide capacitance resulting from a structure in which a plurality of unit capacitors are stacked. As the number of the stacked internal electrodes 12 and the dielectric material layer 11 increases, a contact area thereof may increase, thereby improving the capacitance of the multi-layer capacitor 1. In some embodiments, the internal electrodes 12 may have a cross-sectional area smaller than an area of the dielectric material layer 11. In some embodiments, a plurality of the internal electrodes 12 may each have an identical area, however, the adjacent internal electrodes 12 may be in the different positions along a thickness direction of the multi-layer capacitor 1.

The adjacent internal electrodes 12 may be alternately stacked by partially protruding towards the center line of the multi-layer capacitor 1 from opposing side surfaces of the multi-surface capacitor 1. For example, the internal electrodes 12 may be stacked such that adjacent internal electrodes 12 only partially overlap. The internal electrode 12 may be formed, for example, by placing conductive plates between the dielectric material and/or using an electrically conductive paste including at least one selected from nickel (Ni), copper (Cu), palladium (Pd), and a palladium-silver (Pd—Ag) alloy. A printing method of the electrically conductive paste may be a screen printing method or a gravure printing method, but is not necessarily limited to the method. Any suitable method that may be used as a method of forming an internal electrode in the art may be used. A thickness of the internal electrode 12 may be, for example, in a range of about 100 nm to about 5 μm, about 100 nm to about 4 μm, about 100 nm to about 2.5 μm, about 100 nm to about 1 μm, about 100 nm to about 800 nm, about 100 nm to about 600 nm, about 100 nm to about 400 nm, or about 100 nm to about 200 nm.

As shown in FIG. 1, a plurality of the internal electrodes 12 alternately stacked by being partially protruding in directions of opposing side surfaces of the multi-layered capacitor 1 may be electrically connected to an external electrode 13. In some embodiments, the external electrode 13 may be disposed on a laminate including a plurality of the internal electrodes 12; and the dielectric material layer 11 alternately disposed between a plurality of the internal electrodes 12 and may be connected to the internal electrodes 12. The multi-layer capacitor 1 may include the internal electrodes 12 and the external electrode 13 to which each of the internal electrodes 12 are connected. The multi-layered capacitor 1 may include, for example, a pair of the external electrodes 13 surrounding opposing side surfaces of a laminate structure including the dielectric material layer 11 and the internal electrodes 12. The external electrode 13 may be a material having electrical conductivity, such as metal, and specific materials may be determined in consideration of electrical characteristics and structural stability. The external electrode 13 may have, for example, a multi-layer structure. The external electrode 13 may include, for example, an electrode layer including Ni contacting the laminate and the internal electrodes 12 and a plating layer on the electrode layer.

As shown in FIG. 1, the dielectric material layer 11 in the multi-layer capacitor 1 may be, for example, arranged to have a larger area than an area of the adjacent internal electrode 12. The dielectric material layer 11 disposed between the adjacent internal electrodes 12 in the multi-layer capacitor 1 may be connected to each other. The dielectric material layer 11 disposed between the adjacent internal electrodes 12 may be connected to each other on a side surface in contact with the external electrode 13 in the multi-layered capacitor 1. The external electrode 13, may be, for example, omitted. When the external electrode 13 is omitted, the internal electrodes 12 protruding to the opposing side surfaces of the multi-layered capacitor 1 may be connected to a power source.

In a unit capacitor including the adjacent internal electrodes 12 and the dielectric material layer 11, a thickness of the dielectric material layer 11 (e.g., a gap between the adjacent internal electrodes 12) may be, for example, about 10 nm to about 1 μm, about 50 nm to about 900 nm, about 100 nm to about 800 nm, about 100 nm to about 700 nm, about 100 nm to about 600 nm, about 100 nm to about 500 nm, about 100 nm to about 400 nm, or about 100 nm to about 300 nm. A permittivity of the dielectric material layer 11 at room temperature (about 25° C.) in a range of about 1 kHz to about 1 Mhz in a unit capacitor including the adjacent internal electrodes 12 and the dielectric material layer 11 disposed therebetween may be, for example, 200 or greater, 300 or greater, 400 or greater, 500 or greater, 1,000 or greater, 2,000 or greater, 3,000 or greater, 4,000 or greater, 5,000 or greater, 6,000 or greater, 7,000 or greater, 8,000 or greater, 9,000 or greater, or 10,000 or greater.

As the multi-layered capacitor 1 includes the dielectric material layer 11 having a small thickness and a high permittivity, the multi-layered capacitor 1 may have good capacitance and small thickness and volume. Accordingly, a miniaturized and thinned capacitor with large capacity may be provided.

Figure 2:
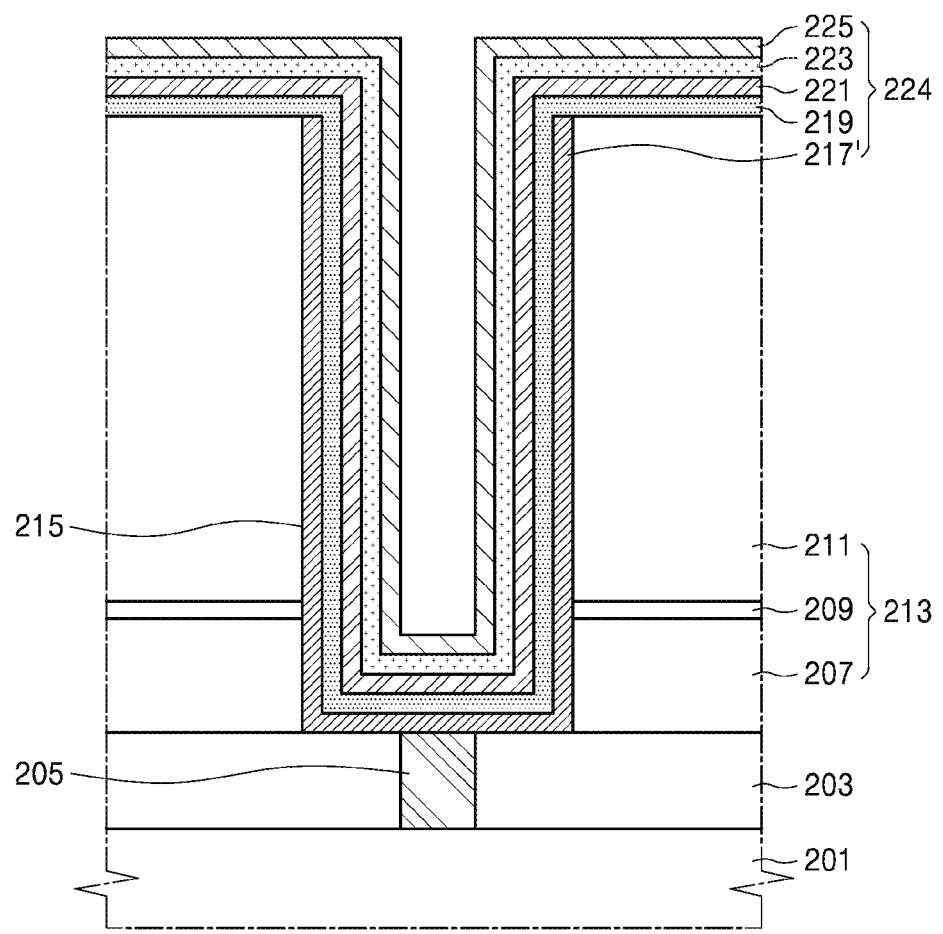
FIG. 2 illustrates a structure of a metal-insulator-metal (MIM) capacitor according to an example embodiment.

FIG. 2 illustrates a structure of a metal-insulator-metal (MIM) capacitor according to an example embodiment.

An interlayer insulating film 203 may be stacked on a semiconductor substrate 201. A contact plug 205 may be formed to fill a contact hole through which the semiconductor substrate 201 is exposed. A mold insulating film 213 may be formed on the semiconductor substrate having the contact plug 205. As illustrated in FIG. 2, the mold insulating film 213 may have a structure in which a lower mold insulating film 207, an etch stop film 209, and an upper mold insulating film 211 are sequentially stacked on the semiconductor substrate having the contact plug 205. However, the example embodiments are not so limited, for example the etch stop film 209 may be formed directly on an upper surface of the contact plug 205 and the interlayer insulating film 203. In other embodiments, the mold insulating film 213 may be formed as a double-layered mold insulating film including the lower mold insulating film 207 and the upper mold insulating film 211, or as a single mold insulating film. The lower mold insulating film 207 and the upper mold insulating film 211 may have an etch selectivity with respect to the etch stop film 209. For example, when the lower mold insulating film 207 and the upper mold insulating film 211 are formed of a silicon oxide film, the etch stop film 209 may be formed of a silicon nitride film. A storage node hole 215 which exposes the upper surface of the contact plug 205 and the upper surface of the interlayer insulating film 203 adjacent to the contact plug 205 may be formed by patterning the mold insulating film 213.

A conductive film may be formed on the entire surface of the semiconductor substrate having the storage node hole 215. The conductive film may be formed as a conductive film having excellent step coverage, resistance to deformation during a subsequent dielectric film forming process, and resistance to oxidation. For example, the conductive film may be formed of at least one metal nitride film (e.g., a titanium nitride film (TiN), a titanium silicon nitride film (TiSiN), a titanium aluminum nitride film (TiAlN), a tantalum nitride film (TaN), a tantalum silicon nitride film (TaSiN), a tantalum aluminum nitride film (TaAlN), and a tungsten nitride film (WN)). The conductive film may be etched to be isolated in the storage node hole 150, forming a lower electrode 217'.

A buffer insulating film (not illustrated) may also be formed on the lower electrode conductive film. The lower electrode 217' isolated in the storage node hole 215, and a buffer insulating film pattern isolated in the storage node hole 215 may be formed. The buffer insulating film pattern may be selectively removed to have a structure exposing the inner wall of the lower electrode. A multi-layer capacitor 224 in which a lower dielectric film 219 and an upper dielectric film 223 are sequentially stacked on the entire surface of the semiconductor substrate 201 having the lower electrode 217' may be formed. The lower dielectric film 219 and the upper dielectric film 223 may be the dielectric material according to the above example embodiments.

An upper electrode 225 may be formed on the upper dielectric film 223. The upper electrode 225 may be formed of a metal film having a larger work function than that of the lower electrode 217'. An intermediate electrode film 221 may be, for example, between the lower dielectric film 219 and the upper dielectric film 223, increasing the contact area between the electrodes and the dielectric layers. The multi-layer capacitor 224, may include further layers, not illustrated.

The MIM capacitor of FIG. 2 may have a concave structure or a cylindrical structure.

Figure 3:
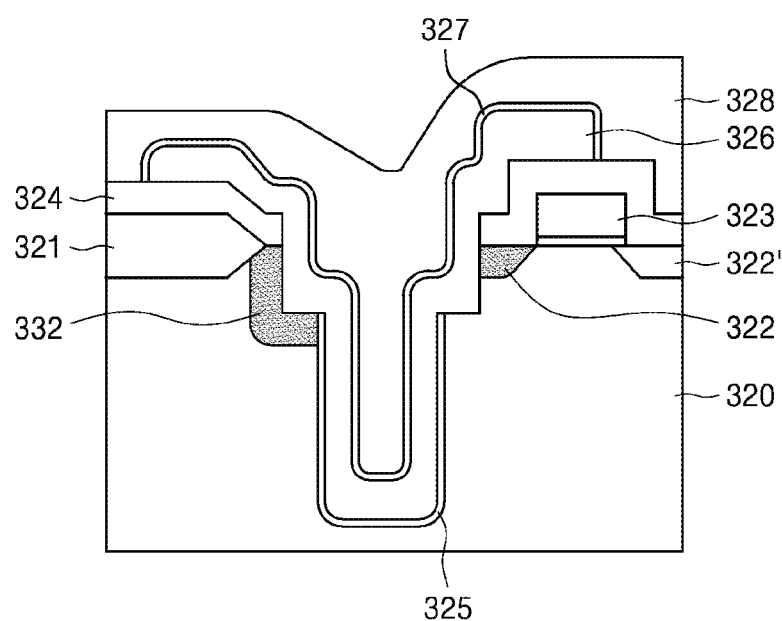
FIG. 3 illustrates a structure of a trench capacitor-type dynamic random access memory (DRAM) according to an example embodiment.

FIG. 3 illustrates a structure of a trench capacitor-type dynamic random access memory (DRAM) according to an example embodiment.

Referring to FIG. 3, on a P-type semiconductor substrate 320, a device isolation region may be defined with a field oxide film 321, and a gate electrode 323 and source/drain impurity regions 222 and 222' may be formed in the device isolation region. A high-temperature oxide (HTO) film may be formed as an interlayer insulating film 324. A region not to be a trench may be capped with a trench buffer layer, and a part of the source region 322 may be open to form a contact portion.

A trench is formed in a sidewall of the interlayer insulating film 324, and a sidewall oxide film 325 may be formed over the entire sidewall of the trench. The sidewall oxide film 325 may compensate for damage in the semiconductor substrate caused by etching to form the trench, and may also serve as a dielectric film between the semiconductor substrate 320 and a storage electrode 326. A sidewall portion of part of the source region 322, except for the other part of the source region near the gate electrode 323, may be entirely exposed.

A PN junction (not illustrated) may be formed in the sidewall portion of the source region by impurity implantation. The trench may be formed in the source region 322. A sidewall of the trench near the gate may directly contact the source region 322, and the PN junction may be formed by additional impurity implantation into the source region.

A storage electrode 326 may be formed on part of the interlayer insulating film 324, the exposed source region, and the surface of the sidewall oxide film 325 in the trench. The storage electrode may be, for example, an embodiment of the multi-layer capacitor, and may be formed so as to contact the entire source region 322 in contact with the upper sidewall of the trench, in addition to the part of the source region 322 near the gate electrode. Next, an insulating film 327, including the dielectric material according to the above example embodiments may be formed along the upper surface of the storage electrode 326, and a plate electrode 328 may be formed thereon. A multi-layer capacitor (not illustrated) may be formed thereon, thereby completing a trench capacitor type DRAM.

A method of preparing a dielectric material may include: preparing a mixture of a layered perovskite compound, including at least one selected from a Dion-Jacobson phase, an Aurivillius phase, and a Ruddlesden-Popper phase, and a metal salt; and heat-treating the mixture in a reducing atmosphere, wherein the metal salt may be represented by Formula 8:

$$M_aX_b \qquad \text{[Formula 8]}$$

wherein, in Formula 8, M may be an element of Group 1, 2, or 3 of the Periodic Table of Elements and/or bismuth (Bi), X may include a monovalent anion, a divalent anion, or a trivalent anion, excluding halogen, and $1 \le a \le 3$ and $1 \le b \le 4$.

The metal included in the metal salt may be identical to at least one of the metals included in the layered perovskite compound. For example, in some embodiments, an alkali metal included in the metal salt may be identical to an alkali metal included in the layered perovskite compound including a Dion-Jacobson phase. Accordingly, an alkali metal of the layered perovskite compound which may be volatilized during a reduction sintering process may be supplemented by the metal salt.

Therefore, in the method of preparing a dielectric material, defects of the dielectric material caused during a reduction process may be suppressed by using a metal salt upon heat treatment in a reducing atmosphere of the layered perovskite compound. In some embodiments, when the layered perovskite compound is heat-treated in a reducing atmosphere without a metal salt, generation of oxygen vacancy and volatilization of an alkali metal in the layered perovskite compound may be significant. Accordingly, temperature characteristics of a permittivity (TCC) and/or a permittivity of the dielectric material prepared from the layered perovskite compound may be deteriorated.

Upon preparation of a laminated capacitor, for example, a precursor of a dielectric material for forming a dielectric material layer and a metal paste for forming an internal electrode may be sequentially stacked and heat-treated simultaneously. In such a heat-treating process, when heat-treating is performed in an oxidative atmosphere, the metal paste may be oxidized. Thus, to prevent oxidation of the metal paste, heat treatment in a reducing atmosphere is required. Accordingly, in such a heat-treating process in a reducing atmosphere, when a precursor of the dielectric material, for example, the layered perovskite compound, is further deteriorated, the resulting laminated capacitor may have deteriorated physical properties. In contrast, in the method of preparing a dielectric material including a metal salt, despite heat treatment during a reduction process, deterioration of a precursor of a dielectric material, e.g., the layered perovskite compound, may be prevented. Thus, preparation of a laminated capacitor having improved physical properties may be possible.

The metal salt used in preparation of a dielectric material may be, for example, represented by Formula 8a:

$$M_a X'_b \quad \text{[Formula 8a]}$$

wherein, in Formula 8a, M may be K, Na, Rb, Bi, or a combination thereof, X' may be an anion selected from $O^{2-}$, $OH^-$, $CO_3^{2-}$, $SO_4^{2-}$, $NO^{3-}$, $PO_4^{3-}$, $ONO_3^{3-}$, and $NO_2^-$, and $1 \le a \le 3$ and $1 \le b \le 4$.

The metal salt used in preparation of a dielectric material may include, for example, at least one selected from $K_2O$, $Na_2O$, $Rb_2O$, $K_2CO_3$, $Na_2CO_3$, $Rb_2CO_3$, $K_2SO_4$, $Na_2SO_4$, $Rb_2SO_4$, $K_2NO_3$, $Na_2NO_3$, $Rb_2NO_3$, KOH, NaOH, RbOH, $K_3PO_4$, $Na_3PO_4$, $Rb_3PO_4$, $KNO_2$, and $NaNO_2$.

A mixture of the layered perovskite compound and the metal salt may include the metal salt, for example, about 1 part to about 20 parts by weight, about 3 parts to about 20 parts by weight, about 5 parts to about 20 parts by weight, about 5 parts to about 15 parts by weight, or about 5 parts to about 10 parts by weight, based on 100 parts by weight of the layered perovskite compound. When a content of the metal salt is low, it may be difficult to prevent defects generated during a reduction sintering process. When a content of the metal salt is high, a content of the layered perovskite compound contained in the dielectric material to be prepared may be lowered, and thus, dielectric characteristics of the dielectric material may be deteriorated.

In the method of preparing a dielectric material, heat-treating in reducing atmosphere may be performed in an atmosphere including a reducing gas like hydrogen. In the atmosphere including hydrogen gas, an amount of hydrogen gas may be, for example, in a range of about 0.1 percent by volume (vol %) to about 10 vol %, about 0.1 vol % to about 5 vol %, about 0.1 vol % to about 3 vol %, about 0.5 vol % to about 2 vol %. However, the reducing atmosphere may include gasses other than hydrogen gas. For example, the reducing atmosphere may include an inert gas. The inert gas may be, for example, argon, nitrogen, or the like. The heat-treating in a reducing atmosphere may be performed, for example, in a temperature range of about 1,000° C. to about 1,200° C., about 1,000° C. to about 1,100° C., or about 1,000° C. to about 1,050° C. By heat-treating in a reducing atmosphere in the temperature range described above, dielectric characteristics of the dielectric material may be further improved. The heat-treating in a reducing atmosphere may be performed, for example, for about 12 hours to about 36 hours, about 12 hours to about 24 hours, or about 12 hours to about 18 hours. By heat-treating in a reducing atmosphere for the time range described above, dielectric characteristics of the dielectric material may be further improved.

In the method of preparing a dielectric material, the method may further include heat-treating in an oxidative atmosphere, after the heat-treating of the mixture in a reducing atmosphere. By further including the heat-treating in an oxidative atmosphere, defects of the layered perovskite compound may be more effectively prevented. The heat-treating in an oxidative atmosphere may be performed in an atmosphere including, for example oxygen, carbon dioxide, or air. In the atmosphere including oxygen, carbon dioxide, or air, an amount of oxygen, carbon dioxide, or air may be, for example, in a range of about 0.1 vol % to about 10 vol %, about 0.1 vol % to about 5 vol %, about 0.1 vol % to about 3 vol %, about 0.5 vol % to about 2 vol %. The oxidizing gas may include gasses other than oxygen, carbon dioxide, or air, for example, an inert gas. The inert gas may be argon, nitrogen, or the like. However, embodiments are not limited thereto. The heat-treating in an oxidative atmosphere may be performed, for example, in a temperature range of about 700° C. to about 1,000° C., about 700° C. to about 900° C., or about 700° C. to about 800° C. By heat-treating in an oxidative atmosphere in the temperature range described above, dielectric characteristics of the dielectric material may be further improved. In the method of preparing a dielectric material, the heat-treating in an oxidative atmosphere may be performed, for example, for about 1 hour to about 12 hours, about 1 hour to about 6 hours, or about 1 hour to about 3 hours. By heat-treating in an oxidative atmosphere for the time range described above, dielectric characteristics of the dielectric material may be further improved.

Hereinafter the inventive concepts will be described in further detail with reference to Examples and Comparative Examples. These examples are for illustrative purposes only and are not intended to limit the scope of the inventive concepts.

(Preparation of Dielectric Material)

Example 1: Preparation of Dielectric Material that is Sinter of Mixture of $KCa_2Na_3Nb_6O_{19}$ and $K_2CO_3$ $K_2CO_3$, $CaCO_3$, and $Nb_2O_5$ were mixed together at a molar ratio of 1.1:2:3. Then, ethanol and zirconia balls were added thereto, followed by performing ball-milling for 24 hours in an air atmosphere at room temperature to prepare a mixture. The prepared mixture was dried at a temperature of 100° C. for 1 day to obtain dry powder. Thus, the contents of $K_2CO_3$, $CaCO_3$, and $Nb_2O_5$ were stoichiometrically controlled to obtain $KCa_2Nb_3O_{10}$.

The dry powder was added to an alumina crucible, and a primary heat treatment was performed for 24 hours in an air atmosphere at a temperature of about 1,200° C. to obtain $KCa_2Nb_3O_{10}$.

It was found that the number of the $NbO_6$ octahedra layers included in the Dion-Jacobson phase of $KCa_2Nb_3O_{10}$ was 3 (n=3).

$NaNbO_3$ was added to $KCa_2Nb_3O_{10}$ at a molar ratio of $KCa_2Nb_3O_{10}$:$NaNbO_3$=1:3. Then, ethanol and zirconia balls were added thereto, followed by performing ball-milling for 24 hours in an air atmosphere at room temperature to prepare a mixture. The prepared mixture was dried to obtain dry powder. The dry powder was added to an alumina crucible, and a secondary heat treatment was performed for 24 hours in an air atmosphere at a temperature of 1,300° C. to obtain $KCa_2Na_3Nb_6O_{19}$. Thus, the contents of $KCa_2Nb_3O_{10}$ and $NaNbO_3$ were stoichiometrically controlled to obtain the desired product, (e.g., $KCa_2Na_3Nb_6O_{19}$).

An X-ray diffraction (XRD) spectrum of $KCa_2Na_3Nb_6O_{19}$ was measured, and it was found that $KCa_2Na_3Nb_6O_{19}$ had a single phase (e.g., a layered perovskite structure including a Dion-Jacobson phase).

It was found that the number of the $NbO_6$ octahedra layers included in the Dion-Jacobson phase of $KCa_2Na_3Nb_6O_{19}$ was 6 (n=6).

Ten parts by weight of $K_2CO_3$ as a metal salt was added to one hundred parts by weight of $KCa_2Na_3Nb_6O_{19}$, and ethanol and zirconia balls were added thereto. Then, ball-milling was performed at room temperature in an air atmosphere for 24 hours to prepare a mixture. The prepared mixture was pressed with a uniaxial pressure to prepare a pellet. The prepared pellet was primary-sintered in a reducing atmosphere (argon atmosphere including 1 vol % of hydrogen) at a temperature of 1,000° C. for 12 hours to obtain a sinter.

The obtained sinter was secondary-sintered in an oxidative atmosphere (nitrogen atmosphere including 1 vol % to 10 vol % of oxygen) at a temperature of 700° C. for 2 hours to prepare a dielectric material.

The prepared dielectric material was a sinter of a layered perovskite compound including a Dion-Jacobson phase having a composition of $KCa_2Na_3Nb_6O_{19}$.

Example 2: Preparation of Dielectric Material that is Sinter of Mixture of $KCa_2Nb_3O_{10}$ and $K_2CO_3$ A dielectric material was prepared in substantially the same manner as in Example 1, except that layered $KCa_2NaNb_3O_{10}$ was used instead of $KCa_2Na_3Nb_6O_{19}$ as a perovskite compound.

The prepared dielectric material was a sinter of a layered perovskite compound including a Dion-Jacobson phase having a composition of $KCa_2Nb_3O_{10}$.

Example 3: Preparation of Dielectric Material that is Sinter of Mixture of $NaKCa_2Nb_3O_{10}$ and $Na_2CO_3$ $Na_2CO_3$, $CaCO_3$, and $Nb_2O_5$ were mixed together at a molar ratio of 1.1:2:3. Then, ethanol and zirconia balls were added thereto, followed by performing ball-milling for 24 hours in an air atmosphere at room temperature to prepare a mixture. The prepared mixture was dried at a temperature of 100° C. for 1 day to obtain dry powder. The contents of $Na_2CO_3$, $CaCO_3$, and $Nb_2O_5$ were stoichiometrically controlled to obtain $NaCa_2Nb_3O_{10}$.

The dry powder was added to an alumina crucible, and a primary heat treatment was performed for 24 hours in an air atmosphere at a temperature of 1,200° C. to obtain $NaCa_2Nb_3O_{10}$.

An XRD spectrum of $NaCa_2Nb_3O_{10}$ was measured, and it was found that $NaCa_2Nb_3O_{10}$ had a single phase (e.g., a layered perovskite structure including a Dion-Jacobson phase).

It was found that the number of the $NbO_6$ octahedra layers included in the Dion-Jacobson phase of $NaCa_2Nb_3O_{10}$ was 3 (n=3).

A dielectric material was prepared in substantially the same manner as in Example 1, except that layered $NaCa_2NaNb_3O_{10}$ was used instead of $KCa_2Na_3Nb_6O_{19}$ as a perovskite compound, and $Na_2CO_3$ was used as a metal salt.

The prepared dielectric material was a sinter of a layered perovskite compound including a Dion-Jacobson phase having a composition of $NaCa_2Nb_3O_{10}$.

Comparative Example 1: Preparation of Dielectric Material that is Sinter of $KCa_2Na_3Nb_6O_{19}$ A dielectric material was prepared in substantially the same manner as in Example 1, except that $K_2CO_3$ was not added in the primary sintering.

Comparative Example 2: Preparation of Dielectric Material that is Sinter of $KCa_2Nb_3O_{10}$ A dielectric material was prepared in substantially the same manner as in Example 2, except that $K_2CO_3$ was not added in the primary sintering.

Comparative Example 3: Preparation of Dielectric Material that is Sinter of $NaCa_2Nb_3O_{10}$ A dielectric material was prepared in substantially the same manner as in Example 3, except that $Na_2CO_3$ was not added in the primary sintering.

Comparative Example 4: Preparation of Dielectric Material that is Sinter of $CsCa_2Nb_3O_{10}$ $Cs_2CO_3$, $CaCO_3$, and $Nb_2O_5$ were mixed together at a molar ratio of 1.1:2:3. Then, ethanol and zirconia balls were added thereto, followed by performing ball-milling for 24 hours in an air atmosphere at room temperature to prepare a mixture. The prepared mixture was dried at a temperature of 100° C. for 1 day to obtain dry powder. The contents of $Cs_2CO_3$, $CaCO_3$, and $Nb_2O_5$ were stoichiometrically controlled to obtain $CsCa_2Nb_3O_{10}$.

The dry powder was added to an alumina crucible, and a primary heat treatment was performed for 24 hours in an air atmosphere at a temperature of 1,200° C. to obtain $CsCa_2Nb_3O_{10}$.

An XRD spectrum of $CsCa_2Nb_3O_{10}$ was measured, and a layered perovskite structure including a Dion-Jacobson phase was found.

It was found that the number of the $NbO_6$ octahedra layers included in the Dion-Jacobson phase of $CsCa_2Nb_3O_{10}$ was 3 (n=3).

A dielectric material was prepared in substantially the same manner as in Example 1, except that 100 parts by weight of $CsCa_2Nb_3O_{10}$ was used instead of 100 parts by weight of $KCa_2Na_3Nb_6O_{19}$, and a metal salt was not added.

The prepared dielectric material was a sinter of a layered perovskite compound including a Dion-Jacobson phase having a composition of $CsCa_2Nb_3O_{10}$.

Evaluation Example 1: XRD Experiment

Figure 4A:
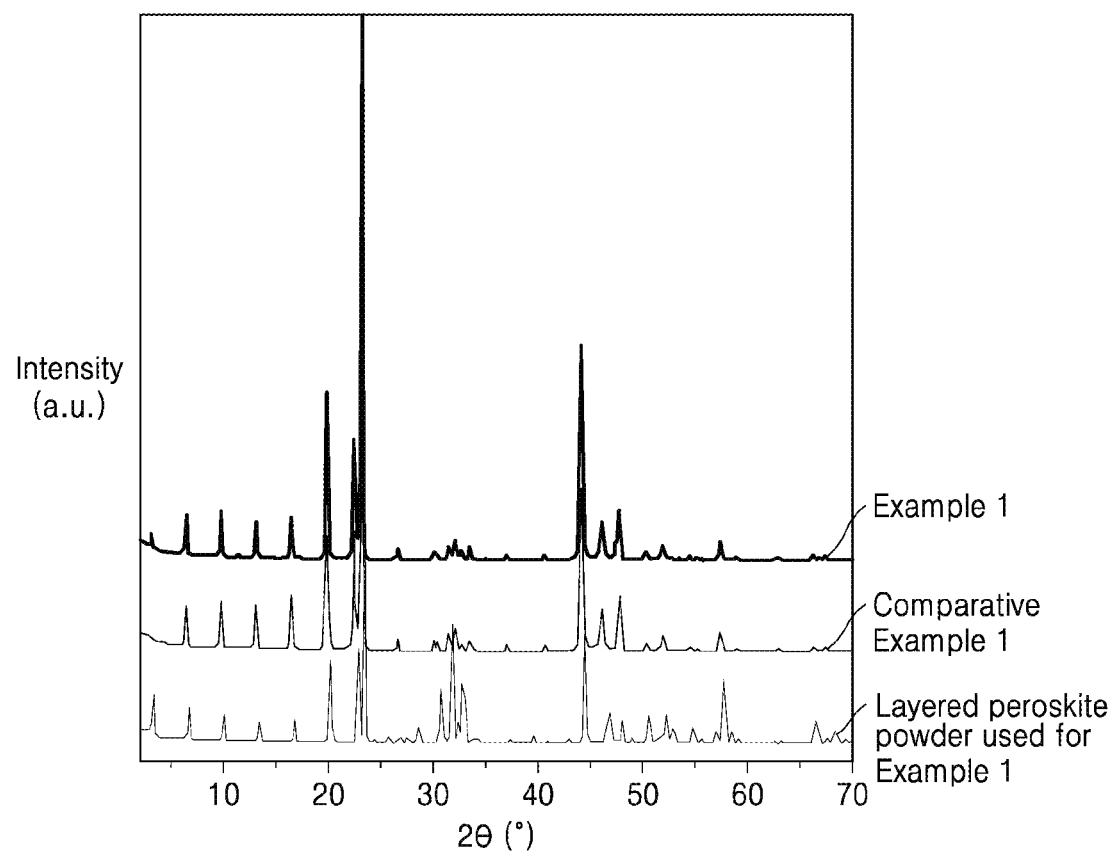
FIG. 4A shows X-ray diffraction (XRD) spectra of the layered perovskite compound prepared in Example 1, the dielectric material prepared in Example 1, and the dielectric material prepared in Comparative Example 1.

The powder XRD spectra of the layered perovskite compound used in preparation of the dielectric material in Example 1, the dielectric material of Example 1 prepared from the layered perovskite compound, and the dielectric material of Comparative Example 1 were measured. The results thereof are shown in FIG. 4A.

Figure 4B:
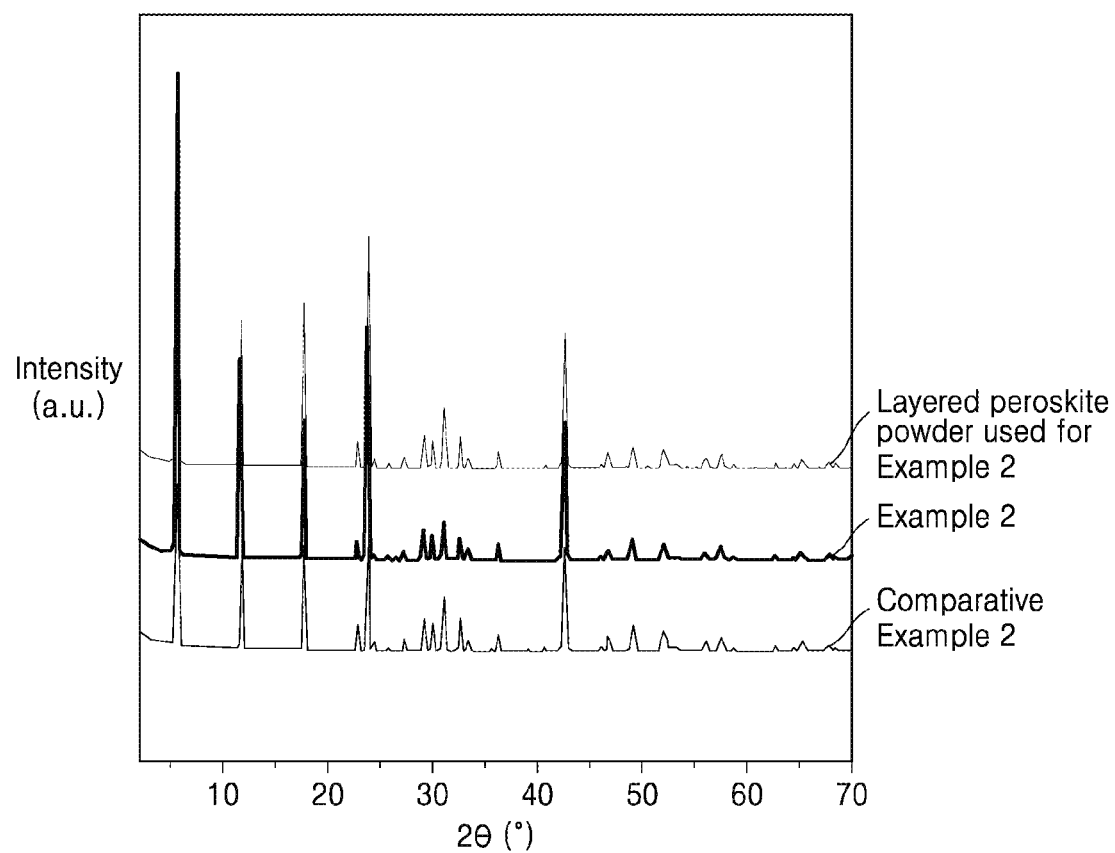
FIG. 4B shows XRD spectra of the layered perovskite compound prepared in Example 2, the dielectric material prepared in Example 2, and the dielectric material prepared in Comparative Example 2.

The powder XRD spectra of the layered perovskite compound used in preparation of the dielectric material in Example 2, the dielectric material of Example 2 prepared from the layered perovskite compound, and the dielectric material of Comparative Example 2 were measured. The results thereof are shown in FIG. 4B.

Figure 4C:
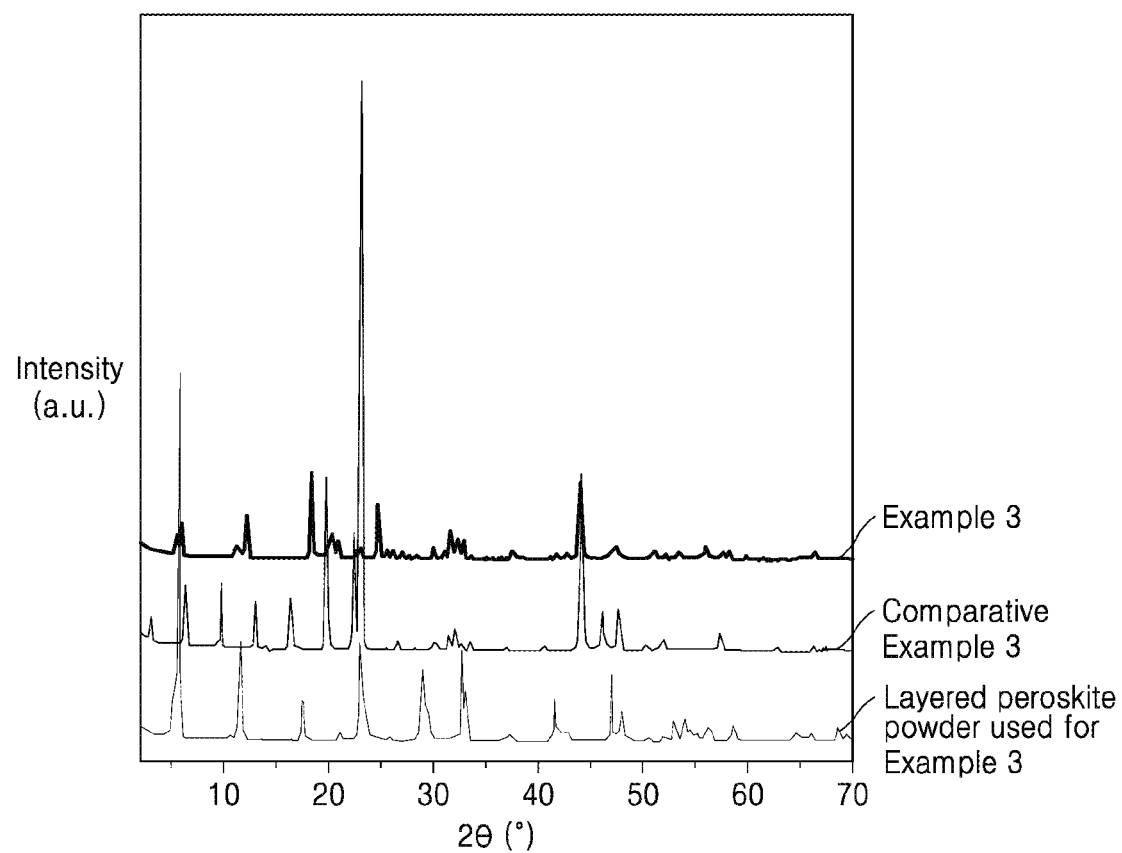
FIG. 4C shows XRD spectra of the layered perovskite compound prepared in Example 3, the dielectric material prepared in Example 3, and the dielectric material prepared in Comparative Example 3.

The powder XRD spectra of the layered perovskite compound used in preparation of the dielectric material in Example 3, the dielectric material of Example 3 prepared from the layered perovskite compound, and the dielectric material of Comparative Example 3 were measured. The results thereof are shown in FIG. 4C.

Figure 4D:
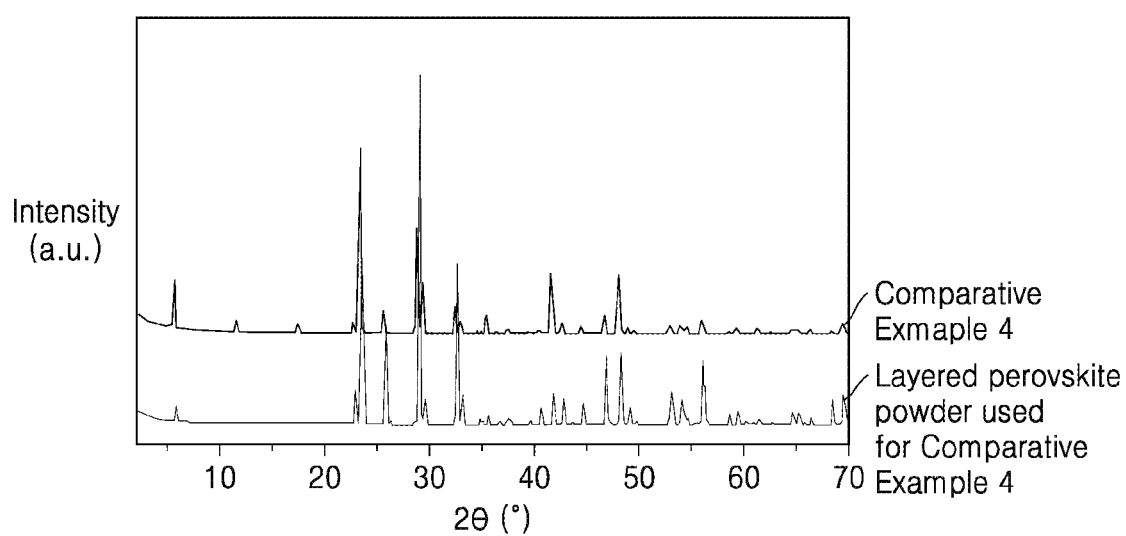
FIG. 4D shows XRD spectra of the layered perovskite compound prepared Comparative Example 4 and the dielectric material prepared in Comparative Example 4.

The powder XRD spectra of the layered perovskite compound used in preparation of the dielectric material in Example 4 and the dielectric material of Comparative Example 4 prepared from the layered perovskite compound were measured. The results thereof are shown in FIG. 4D.

In each XRD spectrum measurement, Cu K$\alpha$ radiation was used. The dielectric materials of Example 1 and Comparative Example 1 were used in the form of powder resulting from pulverization of the pellets.

As shown in FIG. 4A, the dielectric material of Example 1 and the dielectric material of Comparative Example 1 showed substantially the same spectra as a starting material.

As shown in FIG. 4B, the dielectric material of Example 2 and the dielectric material of Comparative Example 2 showed substantially the same spectra as a starting material.

As shown in FIG. 4C, the dielectric material of Example 3 and the dielectric material of Comparative Example 3 showed substantially the same spectra as a starting material.

As shown in FIG. 4D, the dielectric material of Comparative Example 4 showed substantially the same spectrum as a starting material.

Accordingly, the dielectric materials of the Examples and the Comparative Examples were found to include a phase having substantially the same crystal structure as the layered perovskite starting compound material.

Evaluation Example 2: Raman Spectrum Experiment

Figure 5:
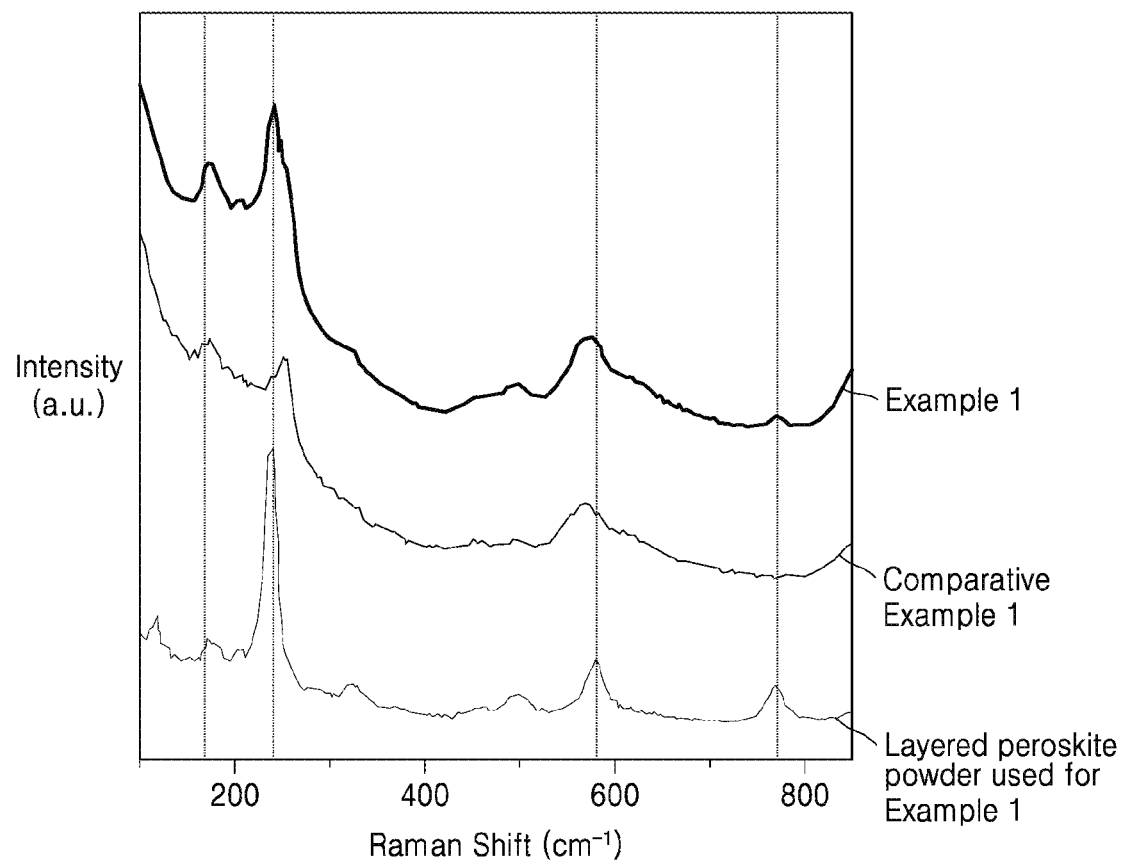
FIG. 5 shows Raman spectra of the layered perovskite compound prepared in Example 1, the dielectric material prepared in Example 1, and the dielectric material prepared in Comparative Example 1.
Figure 6:
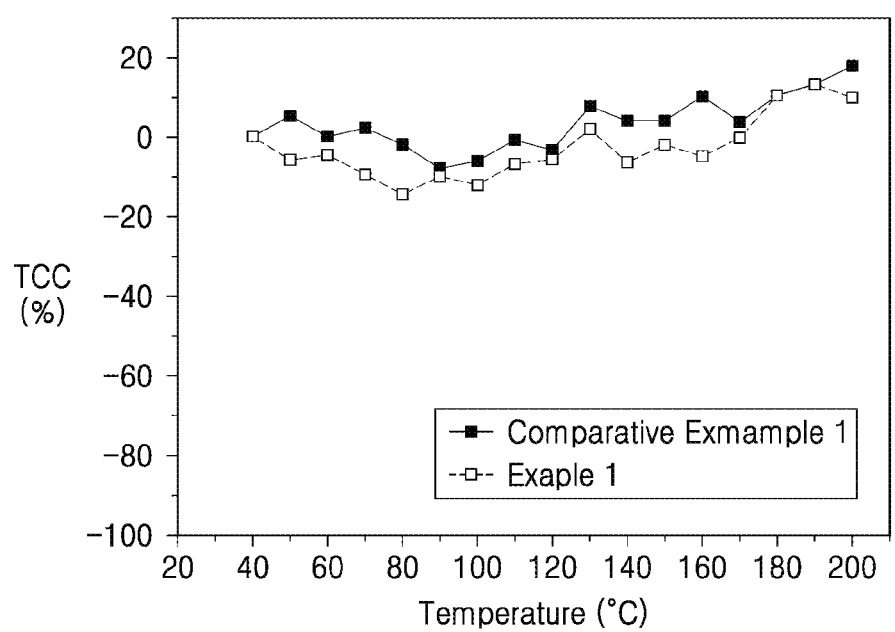
FIG. 6 is a graph that shows evaluation results of temperature characteristics of a permittivity (TCC) with respect to the dielectric materials prepared in Example 1 and Comparative Example 1.

The Raman spectra of the layered perovskite compound used in preparation of the dielectric material in Example 1, the dielectric material of Example 1 prepared from the layered perovskite compound, and the dielectric material of Comparative Example 1 were measured. The results thereof are shown in FIG. 5. The dielectric materials of Example 1 and Comparative Example 1 were used in the form of powder resulting from pulverization of the pellets.

As shown in FIG. 5, the dielectric material of Comparative Example 1 obtained by sintering without using a metal salt was found to have a peak broadening due to shifting about 10 cm$^{-1}$ of the peak shown in a range of 200 cm$^{-1}$ to 300 cm$^{-1}$ to a higher wave number, as compared with the layered perovskite compound used in preparation of the dielectric material. Such shift and broadening of the Raman peak is deemed as being caused by structural defects of the layered perovskite compound included in the sinter due to oxygen vacancy or volatilization of alkali metal generated during a reduction sintering process required for the preparation of a dielectric material.

In contrast, the dielectric material of Example 1 was found to have a sharp peak in the same position as the layered perovskite compound used in preparation of the dielectric material. In other words, little peak shift occurred.

Such reduction in shift and sharpening of the Raman peak may be due to suppressing of structural defects of the layered perovskite compound included in the sinter by preventing, by using the metal salt, oxygen vacancy or volatilization of alkali metal that may be generated during a reductive sintering process required for the preparation of a dielectric material. That is, it is deemed that structural stability of the layered perovskite compound used in preparation of the dielectric material was maintained despite the reduction sintering process.

Evaluation Example 3: Measurement of Permittivity and Evaluation of Temperature Characteristics of Permittivity Silver (Ag) electrode was coated on both sides of the dielectric material pellets prepared in Examples 1 to 3 and Comparative Examples 1 to 4 to prepare samples. The permittivity of each of the samples having electrodes formed on both sides was measured using a LCR meter (E4980A available from Agilent) at a temperature of 25° C. under a condition of 1 kHz/1.0 V. In order to identify the temperature characteristics of a permittivity (TCC), temperature coefficient of capacitance, capacitance was measured in a thermo-hygrostat at an interval of 10° C. from 40° C. to 200° C. according to the Electrical Industries Association (EIA) specification of X7R. The partial results thereof are shown in FIG. 3 and Table 1. The temperature characteristics of a permittivity may be represented by Equation 1 below. The temperature characteristics of a permittivity may be obtained by measuring capacitance according to the temperature.

TCC (%)=[(capacitance at a temperature of 200° C.−capacitance at a temperature of 40° C.)/capacitance at a temperature of 40° C.]×100%  Equation 1

TABLE 1

|  | Permittivity | TCC [%] |
|---|---|---|
| Example 1 | 1680 | 9.9 |
| Comparative Example 1 | 1690 | 17.9 |
| Example 2 | 840 | −5.5 |
| Comparative Example 2 | 100 | −4.6 |
| Example 3 | 240 | −13.8 |
| Comparative Example 3 | 14300 | −47 |
| Comparative Example 4 | 120 | −22.3 |

As shown in Table 1, the dielectric materials of Examples 1 to 3 were found to have a permittivity of 200 or greater, while showing a change in capacitance in a range of −15% to 15% in a temperature ranging from 40° C. to 200° C.

Accordingly, the dielectric materials of Examples 1 to 3 exhibited satisfactory permittivity as well as stable temperature characteristics of a permittivity.

In addition, the dielectric materials of Examples 1 and 2 were found to have improved temperature characteristics of a permittivity and permittivity, as compared with the dielectric material of Example 3.

In contrast, the dielectric materials of Comparative Examples 1 to 4 were found to have deteriorated temperature characteristics of a permittivity and a significantly low permittivity.

As apparent from the foregoing description, a device with improved dielectric characteristics may be provided by including a dielectric material having structural stability and physical properties.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A dielectric material comprising:
a layered perovskite compound comprising a material phase of at least one selected from a Dion-Jacobson phase, an Aurivillius phase, and a Ruddlesden-Popper phase,
wherein a temperature coefficient of capacitance (TCC) of a capacitance at 200° C. with respect to a capacitance at 40° C. in a range of about −15 percent (%) to about 15%, and
a permittivity is 200 or greater in a range of about 1 kilohertz (kHz) to about 1 megahertz (MHz).

2. The dielectric material of claim 1, wherein the layered perovskite compound comprising the Dion-Jacobson phase is represented by Formula 1:

$$AB_2C_{n-3}D_nO_{3n+1} \quad \text{(Formula 1)}$$

wherein, in Formula 1,
A includes a monovalent element,
B includes a divalent element,
C includes a monovalent element,
D includes a pentavalent element, and
n is an integer from 3 to 6.

3. The dielectric material of claim 1, wherein A and C in Formula 1 each independently include at least one of sodium (Na), potassium (K), and rubidium (Rb).

4. The dielectric material of claim 1, wherein B in Formula 1 includes at least one of calcium (Ca), strontium (Sr), and barium (Ba).

5. The dielectric material of claim 1, wherein D in Formula 1 includes at least one of niobium (Nb), vanadium (V), and tantalum (Ta).

6. The dielectric material of claim 1, wherein the layered perovskite compound comprising the Dion-Jacobson phase is represented by Formula 2:

$$ACa_2C_{n-3}Nb_nO_{3n+1} \quad \text{(Formula 2)}$$

wherein, in Formula 2,
A includes at least one of Na, K, and Rb,
C includes at least one of Na, K, and Rb, and
n is an integer from 3 to 6.

7. The dielectric material of claim 1, wherein the layered perovskite compound comprising the Dion-Jacobson phase comprising at least one of
$KCa_2Nb_3O_{10}$, $KCa_2NaNb_4O_{13}$, $KCa_2Na_2Nb_5O_{16}$, $KCa_2Na_3Nb_6O_{19}$, $KCa_2KNb_4O_{13}$, $KCa_2K_2Nb_5O_{16}$, $KCa_2K_3Nb_6O_{19}$, $KCa_2RbNb_4O_{13}$, $KCa_2Rb_2Nb_5O_{16}$, $KCa_2Rb_3Nb_6O_{19}$, $NaCa_2Nb_3O_{10}$, $NaCa_2KNb_4O_{13}$, $NaCa_2K_2Nb_5O_{16}$, $NaCa_2K_3Nb_6O_{19}$, $NaCa_2NaNb_4O_{13}$, $NaCa_2Na_2Nb_5O_{16}$, $NaCa_2Na_3Nb_6O_{19}$, $NaCa_2RbNb_4O_{13}$, $NaCa_2Rb_2Nb_5O_{16}$, $NaCa_2Rb_3Nb_6O_{19}$, $RbCa_2Nb_3O_{10}$, $RbCa_2KNb_4O_{13}$, $RbCa_2K_2Nb_5O_{16}$, $RbCa_2K_3Nb_6O_{19}$, $RbCa_2RbNb_4O_{13}$, $RbCa_2Rb_2Nb_5O_{16}$, $RbCa_2Rb_3Nb_6O_{19}$, $RbCa_2NaNb_4O_{13}$, $RbCa_2Na_2Nb_5O_{16}$, and $RbCa_2Na_3Nb_6O_{19}$.

8. The dielectric material of claim 1, wherein the dielectric material is a sinter of the layered perovskite compound comprising at least one selected from the Dion-Jacobson phase, the Aurivillius phase, and the Ruddlesden-Popper phase.

9. The dielectric material of claim 8, wherein a difference between a position of a peak shown in a range of about 200 reciprocal centimeters ($cm^{-1}$) to about 300 $cm^{-1}$ in a Raman spectrum of the dielectric material and a position of a peak shown in a range of about 200 $cm^{-1}$ to about 300 $cm^{-1}$ in a Raman spectrum of a non-sintered layered perovskite compound used in preparing the dielectric material is 5 $cm^{-1}$ or less.

10. The dielectric material of claim 1, wherein the layered perovskite compound comprising the Aurivillius phase is represented by Formula 3:

$$(Bi_2O_2)(A'_{n-1}B'_nO_{3n+1}) \quad \text{(Formula 3)}$$

wherein, in Formula 3,
A' includes at least one of a monovalent, a divalent, and a trivalent element,
B' includes at least one of a trivalent, a pentavalent, and a hexavalent element, and
n is an integer from 3 to 6.

11. The dielectric material of claim 10, wherein A' in Formula 3 includes at least one of Na, K, Rb, Ca, and Sr, and
B' includes at least one of scandium (Sc), lanthanum (La), titanium (Ti), zirconium (Zr), hafnium (Hf) vanadium (V), niobium (Nb), tantalum (Ta), chromium (Cr), molybdenum (Mo), tungsten (W), manganese (Mn), technetium (Tc), rhenium (Re), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), zinc (Zn), aluminum (Al), gallium (Ga), indium (In), and thallium (Tl).

12. The dielectric material of claim 1, wherein the layered perovskite compound comprising the Ruddlesden-Popper phase is represented by Formula 4:

$$A''_{n''-1}B''_2C''_{n''}O_{3n''+1} \quad \text{(Formula 4)}$$

wherein, in Formula 4,
A'' includes at least one of a monovalent, a divalent, and a trivalent element,
B'' includes at least one of a monovalent, a divalent, and a trivalent element,
C'' includes at least one of a trivalent, a quadrivalent, a pentavalent, and a hexavalent element, and
n'' is an integer from 1 to 6.

13. The dielectric material of claim 12, wherein A'' and B'' each independently include at least one of Na, K, Rb, Ca, Sr, and Ba, and
C'' includes at least one of Sc, La, Ti, Zr, Hf, V, Nb, Ta, Cr, Mo, W, Mn, Tc, Re, Fe, Ru, Os, Co, Rh, Ir, Ni, Pd, Pt, Cu, Ag, Au, Zn, Al, Ga, In, and Tl.

14. The dielectric material of claim 1, further comprising a metal salt,
wherein the layered perovskite compound and the metal salt is in a solid solution.

15. The dielectric material of claim 14, wherein the solid solution of the layered perovskite compound and the metal salt is represented by Formulae 5 to 7:

$$xM_aX_{b^-(1-x)}\cdot AB_2C_{n-3}D_nO_{3n+1} \quad \text{(Formula 5)}$$

wherein, in Formula 5,
A includes a monovalent element,
B includes a divalent element,
C includes a monovalent element, D includes a pentavalent element, and
n is an integer from 3 to 6,
M includes an element of Group 1, 2, or 3 of the Periodic Table of Elements,
X includes a monovalent anion, a divalent anion, or a trivalent anion, excluding halogen, and
$0<x<1$, $1 \le a \le 3$, and $1 \le b \le 4$;

$$xM_aX_b\text{-}(1-x)[(Bi_2O_2)(A'_{n-1}B'_nO_{3n+1})] \quad \text{(Formula 6)}$$

wherein, in Formula 6,
A' includes a monovalent, divalent, or trivalent element,
B' includes a trivalent, pentavalent, or hexavalent element, and
n is an integer from 3 to 6,
M includes an element of Group 1, 2, or 3 of the Periodic Table of Elements,
X includes a monovalent anion, a divalent anion, or a trivalent anion, excluding halogen, and
$0<x<1$, $1 \le a \le 3$, and $1 \le b \le 4$;

$$xM_aX_b\text{-}(1-x)A''_{n-1}B''_2C''_nO_{3n+1} \quad \text{(Formula 7)}$$

wherein, in Formula 7,
A" includes a monovalent, divalent, or trivalent element,
B" includes a monovalent, divalent, or trivalent element,
C" includes a trivalent, quadrivalent, pentavalent, or hexavalent element, and
n is an integer from 1 to 6,
M includes an element of Group 1, 2, or 3 of the Periodic Table of Elements,
X includes a monovalent anion, a divalent anion, or a trivalent anion, excluding halogen, and
$0<x<1$, $1 \le a \le 3$, and $1 \le b \le 4$.

16. A device comprising:
a plurality of electrodes; and
the dielectric material of claim 1 disposed between a plurality of the electrodes.

17. The device of claim 16, wherein the device is a capacitor.

18. The device of claim 17, wherein the capacitor is a laminated capacitor,
the plurality of electrodes include a plurality of internal electrodes, and
the dielectric material is alternately disposed between the plurality of internal electrodes.

19. The device of claim 18, wherein a permittivity of the dielectric material is 500 or greater in a range of about 1 kHz to about 1 MHz.

20. A method of preparing a dielectric material comprising:
preparing a mixture of a layered perovskite compound and a metal salt, the layered perovskite compound comprising a material phase of at least one selected from a Dion-Jacobson phase, an Aurivillius phase, and a Ruddlesden-Popper phase; and
heat-treating the mixture in a reducing atmosphere,
wherein the metal salt is represented by Formula 8:

$$M_aX_b \quad \text{(Formula 8)}$$

wherein, in Formula 8, M includes at least one selected from bismuth (Bi) and an element of Group 1, 2, and 3 of the Periodic Table of Elements,
X includes a monovalent anion, a divalent anion, or a trivalent anion, excluding halogen, and
$1 \le a \le 3$ and $1 \le b \le 4$.

21. The method of claim 20, wherein the metal salt is represented by Formula 8a:

$$M_aX'_b \quad \text{(Formula 8a)}$$

wherein, in Formula 8a, M includes at least one of K, Na, Rb, and Bi,
X' includes at least one of an anion selected from $O^{2-}$, $OH^-$, $CO_3^{2-}$, $SO_4^{2-}$, $NO^{3-}$, $PO_4^{3-}$, $ONO_3^{3-}$, and $NO_2^-$, and
$1 \le a \le 3$ and $1 \le b \le 4$.

22. The method of claim 20, wherein the metal salt comprises at least one selected from $K_2O$, $Na_2O$, $Rb_2O$, $K_2CO_3$, $Na_2CO_3$, $Rb_2CO_3$, $K_2SO_4$, $Na_2SO_4$, $Rb_2SO_4$, $K_2NO_3$, $Na_2NO_3$, $Rb_2NO_3$, KOH, NaOH, RbOH, $K_3PO_4$, $Na_3PO_4$, $Rb_3PO_4$, $KNO_2$, and $NaNO_2$.

23. The method of claim 20, wherein the mixture comprises 5 to 20 parts by weight of the metal salt, based on 100 parts by weight of the layered perovskite compound.

24. The method of claim 20, wherein the heat-treating of the mixture in a reducing atmosphere is performed in a temperature ranging from 1,000° C. to 1,200 C.° for 12 hours to 36 hours in an atmosphere comprising hydrogen gas.

25. The method of claim 20, wherein the method further comprises heat-treating in an oxidative atmosphere, after the heat-treating of the mixture in a reducing atmosphere.

26. The method of claim 25, wherein the heat-treating of the mixture in an oxidative atmosphere is performed in a temperature ranging from 700° C. to 1,000° C. for 1 hour to 12 hours in an atmosphere comprising at least one of oxygen, carbon dioxide, and ambient air.

* * * * *